United States Patent
Usami

(10) Patent No.: US 10,658,162 B2
(45) Date of Patent: May 19, 2020

(54) SEMICONDUCTOR MANUFACTURING APPARATUS

(71) Applicant: TOSHIBA MEMORY CORPORATION, Minato-ku, Tokyo (JP)

(72) Inventor: Tatsumi Usami, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 112 days.

(21) Appl. No.: 15/695,819

(22) Filed: Sep. 5, 2017

(65) Prior Publication Data
US 2018/0261437 A1 Sep. 13, 2018

(30) Foreign Application Priority Data

Mar. 8, 2017 (JP) ................... 2017-044119

(51) Int. Cl.
*C23C 14/34* (2006.01)
*H01J 37/34* (2006.01)
*H01L 21/203* (2006.01)
*C23C 14/35* (2006.01)

(52) U.S. Cl.
CPC .......... *H01J 37/3405* (2013.01); *C23C 14/35* (2013.01); *H01J 37/3452* (2013.01); *H01J 37/3455* (2013.01); *H01L 21/203* (2013.01); *B65G 2249/04* (2013.01)

(58) Field of Classification Search
CPC ........................ H01J 37/3455; H01J 37/3452
See application file for complete search history.

(56) References Cited

U.S. PATENT DOCUMENTS

| 5,194,131 | A | 3/1993 | Anderson |
| 8,663,431 | B2* | 3/2014 | Morohashi ............ C23C 14/352 204/192.1 |
| 2009/0205949 | A1* | 8/2009 | Zueger ................ H01J 37/3408 204/192.12 |
| 2015/0075970 | A1* | 3/2015 | Miller ................. H01J 37/3452 204/192.12 |

FOREIGN PATENT DOCUMENTS

| EP | 1 211 332 | 6/2002 |
| JP | H06-504092 A | 5/1994 |
| JP | H10-102246 A | 4/1998 |
| JP | 2006-291262 A | 10/2006 |
| JP | 2010-037656 | 2/2010 |
| WO | WO-01/02618 A1 | 1/2011 |

\* cited by examiner

*Primary Examiner* — Jason Berman
(74) *Attorney, Agent, or Firm* — Foley & Lardner LLP

(57) ABSTRACT

A semiconductor manufacturing apparatus includes a vacuum chamber, a rotary member, a first magnet, a second magnet, and a magnetic body. The vacuum chamber contains a substrate and a target located opposite to the substrate. The rotary member has a first surface located on a back side of the target outside the vacuum chamber. The first magnet is provided on the first surface. The second magnet has a magnetic pole opposite to a magnetic pole of the first magnet and is provided on an inner side of the first magnet on the first surface. The magnetic body is provided between the first magnet and the second magnet and is configured to be movable backward and forward in a vertical direction.

5 Claims, 2 Drawing Sheets

SEMICONDUCTOR MANUFACTURING APPARATUS

CROSS-REFERENCE TO RELATED APPLICATION

This application claims the benefit of and priority to Japanese Patent Application No. 2017-044119, filed Mar. 8, 2017, the entire contents of which are incorporated herein by reference.

FIELD

Embodiments described herein relate generally to a semiconductor manufacturing apparatus.

BACKGROUND

A sputtering apparatus using magnets (or a magnetron sputtering apparatus) is a semiconductor manufacturing apparatus. In the magnetron sputtering apparatus, when a film is formed on a substrate, a magnetic field is generated between the substrate and a target due to magnets. At this time, the uniformity of the film may be impaired according to consumption of the target. Hence a need exists for methods and apparatuses for ensuring the uniformity of the film.

DETAILED DESCRIPTION

In a magnetron sputtering apparatus, when a film is formed on a substrate, a magnetic field is generated between the substrate and a target due to magnets. At this time, the uniformity of the film may be impaired according to consumption of the target. In order to ensure the uniformity of the film, it is desirable to change the strength of the magnetic field.

However, in some magnetron sputtering apparatus, the once set magnetic field strength cannot be changed. Therefore, a large-scale operation such as replacement of magnets may be performed, and, as a result, the operation rate of the apparatus may decrease.

An example embodiment provides a semiconductor manufacturing apparatus capable of preventing a decrease in operation rate.

In general, according to some embodiments, a semiconductor manufacturing apparatus may include a vacuum chamber, a rotary member, a first magnet, a second magnet, and a magnetic body. In some embodiments, the vacuum chamber may be configured to contain a substrate and a target located opposite to the substrate. In some embodiments, the rotary member may have a first surface located on a back side of the target outside the vacuum chamber. In some embodiments, the first magnet may be provided on the first surface. In some embodiments, the second magnet may have a magnetic pole opposite to a magnetic pole of the first magnet and may be provided on an inner side of the first magnet on the first surface. In some embodiments, the magnetic body may be provided between the first magnet and the second magnet and may be configured to be movable backward and forward in a vertical direction.

Hereinafter, some embodiments of the present disclosure will be described with reference to the drawings. The embodiments should not be construed to limit the present disclosure.

Figure 1:
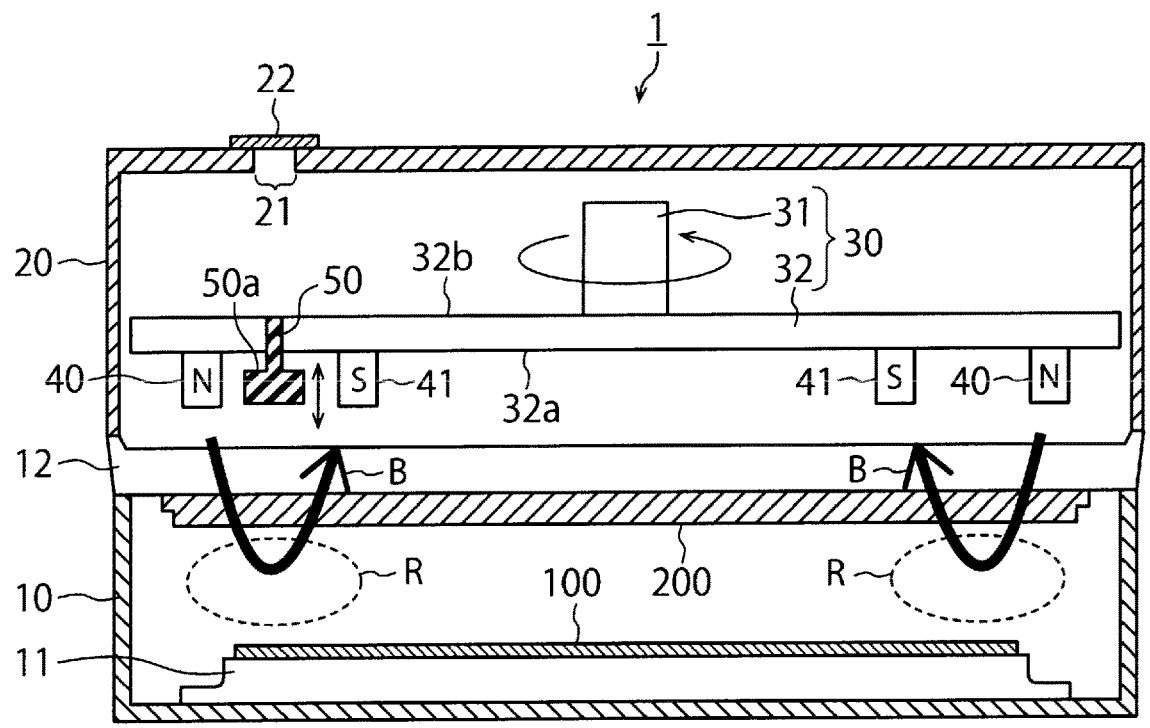
FIG. 1 is a schematic sectional view of a semiconductor manufacturing apparatus according to some embodiments.

FIG. 1 is a schematic sectional view of a semiconductor manufacturing apparatus according to some embodiments. The semiconductor manufacturing apparatus 1 according to some embodiments may be a sputtering apparatus using magnets or a magnetron sputtering apparatus. In some embodiments, the semiconductor manufacturing apparatus 1 includes a vacuum chamber 10, an electrostatic chuck 11, a packing member 12, a water tank 20, a rotary member 30, a first magnet 40, a second magnet 41, and a magnetic body 50.

In some embodiments, the vacuum chamber 10 contains a substrate 100 and a target 200. In some embodiments, the substrate 100 may include, for example, a silicon substrate. In some embodiments, the target 200 may include, for example, a metallic member such as aluminum.

In some embodiments, the electrostatic chuck 11 may fix the substrate 100 in the vacuum chamber 10. In some embodiments, the packing member 12 may hermetically seal the vacuum chamber 10 so as to keep a vacuum state thereof. In some embodiments, the target 200 may be fixed to the packing member 12. In some embodiments, the substrate 100 and the target 200 may be located opposite to each other in the vacuum chamber 10.

In some embodiments, the water tank 20 is provided on the packing member 12. In some embodiments, the rotary member 30, the first magnet 40, the second magnet 41, and the magnetic body 50 may be contained in the water tank 20. In some embodiments, water used to cool the target 200 may be stored in the water tank 20. Therefore, in some embodiments, the materials of the rotary member 30, the first magnet 40, the second magnet 41, and the magnetic body 50 may have properties resistant to corrosion.

In some embodiments, a hole portion 21 is provided on the upper portion of the water tank 20. In some embodiments, the hole portion 21 may be formed to allow a tool to be inserted into the water tank 20 for adjusting the position of the magnetic body 50. In some embodiments, when the rotary member 30 is rotating, the hole portion 21 may be closed by a lid portion 22 to prevent water leakage.

In some embodiments, the rotary member 30 includes a shaft member 31 and a supporting member 32. In some embodiments, the rotary member 30 may rotate with the shaft member 31 serving as the axis of rotation. In some embodiments, the shaft member 31 may be provided at the center of the supporting member 32. In some embodiments, the supporting member 32 may have a first surface 32a, which is located on the back side of the target 200, and a second surface 32b, which is opposite to the first surface 32a.

Figure 2:
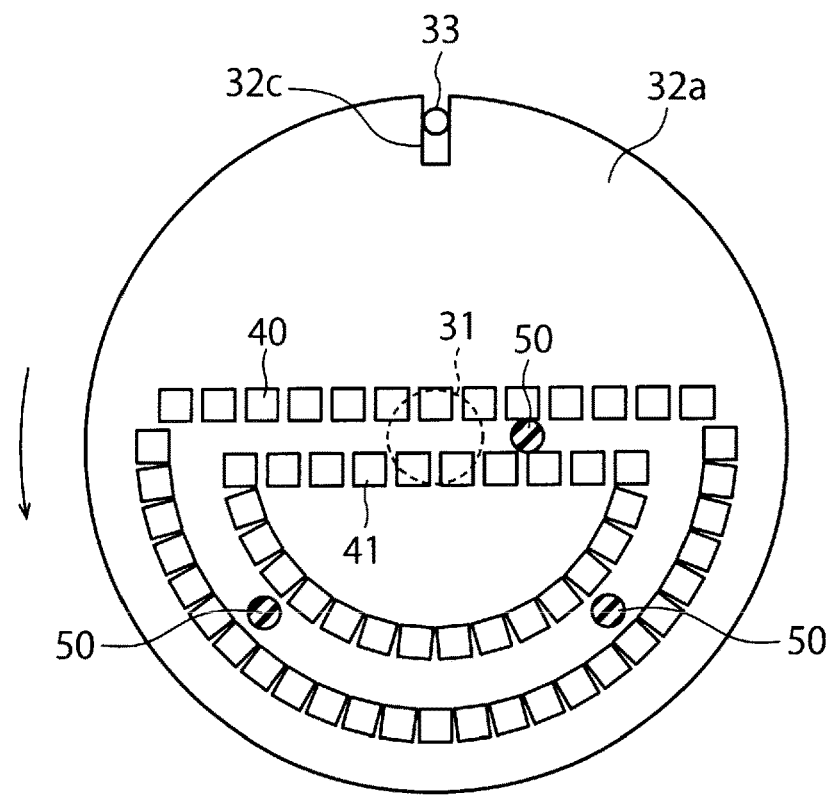
FIG. 2 is a plan view of a supporting member as viewed from a first surface thereof.

FIG. 2 is a plan view of the supporting member 32 as viewed from the side of the first surface 32a. In some embodiments, the first magnet 40 is mounted in a semicircular shape (first semicircular shape) on the first surface 32a. In some embodiments, the second magnet 41 is mounted on an inner side of the first magnet 40 in a semicircular shape (second semicircular shape) similar to the semicircular shape of the first magnet 40. In some embodiments, the magnetic pole of the first magnet 40 may be the N pole and the magnetic pole of the second magnet 41 may be the S pole. In some embodiments, the magnetic pole of the first magnet 40 may be the S pole and the magnetic pole of the second magnet 41 may be the N pole.

In some embodiments, as illustrated in FIG. 2, a cutout 32c is provided at an outer circumference portion of the supporting member 32. In some embodiments, the cutout 32c may be a mark used to stop the supporting member 32, which is rotating, at such a position as to cause the magnetic body 50 to face the hole portion 21 of the water tank 20. In some embodiments, the cutout 32c may be a mark used to stop the supporting member 32, which is rotating, at a position which allows for adjusting the magnetic body 50. In this position, in some embodiments, an optical sensor 33 faces the cutout 32c, so that the optical sensor 33 can receive light to identify the position of the supporting member 32. Therefore, in some embodiments, the supporting member 32 can be stopped at the above-mentioned position based on the light-receiving state of the optical sensor 33.

In some embodiments, the magnetic body 50 may be mounted between the diameter portion of the semicircular shape of the first magnet 40 and the diameter portion of the semicircular shape of the second magnet 41. In some embodiments, the magnetic body 50 may be mounted between the arc portion of the semicircular shape of the first magnet 40 and the arc portion of the semicircular shape of the second magnet 41. In some embodiments, the magnetic body 50 may be mounted both between the diameter portion of the semicircular shape of the first magnet 40 and the diameter portion of the semicircular shape of the second magnet 41 and between the arc portion of the semicircular shape of the first magnet 40 and the arc portion of the semicircular shape of the second magnet 41. In some embodiments, the former magnetic body 50 may be used to adjust the thickness of a film formed in the vicinity of the center of the substrate 100, which is in a wafer shape. In some embodiments, the latter magnetic body 50 may be used to adjust the thickness of a film formed in the vicinity of the outer circumference of the substrate 100.

In some embodiments, the magnetic body 50 may be provided in the supporting member 32 in such a way as to be movable backward and forward in a vertical direction, or a direction substantially orthogonal to the first surface 32a or the second surface 32b of the supporting member 32. In some embodiments, the supporting member 32 may be provided with a threaded hole with which the magnetic body 50 is engaged. In this case, in some embodiments, when the operator inserts the tool into the water tank 20 through the hole portion 21 and rotates the magnetic body 50 clockwise and counterclockwise, a head portion 50a (see FIG. 1) of the magnetic body 50 may move backward and forward in the vertical direction between the supporting member 32 and the packing member 12. In some embodiments, the head portion 50a may be in a disk shape or cylindrical shape. In some embodiments, the head portion 50a may be in a shape other than a disk shape or cylindrical shape. In a case where the head portion 50a is in a disk shape or cylindrical shape, the magnetic field strength formed by the first magnet 40 and the second magnet 41 can be uniformly changed in all directions.

A film forming process using the semiconductor manufacturing apparatus 1 according to some embodiments is described below in brief. In some embodiments, in the semiconductor manufacturing apparatus 1, as illustrated in FIG. 1, magnetic lines of force B leading from the first magnet 40 to the second magnet 41 via the inside of the vacuum chamber 10 may occur. Therefore, in the vacuum chamber 10, a plasma region R may occur between the substrate 100 and the target 200.

In some embodiments, in the plasma region R, the plasma density of a noble gas (for example, argon) previously injected into the vacuum chamber 10 may become high, so that metal particles (for example, aluminum particles) sputtered from the target 200 to the substrate 100 may increase. Therefore, the time required to form a film on the substrate 100 can be shortened. At this time, in some embodiments, in a case where the formed film thickness on the substrate 100 is not uniform, the position of the magnetic body 50 corresponding to a non-uniform portion may be adjusted in the above-described method.

In some embodiments, in a case where the film thickness of a central portion of the substrate 100 is greater than the film thickness of another portion, the magnetic body 50 corresponding to the central portion, specifically, the magnetic body 50 mounted near the shaft member 31, may be moved closer to the side of the target 200. In this case, since a part of the magnetic line of force B is absorbed by the magnetic body 50, the magnetic field strength may weaken. As a result, since the amount of sputtering decreases locally, the non-uniformity of the film thickness can be corrected.

In some embodiments, as described above, the magnetic field strength can be locally changed by adjusting the position of the magnetic body 50. This allows for improving the uniformity of the thickness of a film formed on the substrate 100. In some embodiments, the position of the magnetic body 50 can be adjusted by inserting a tool (for example, a screw driver) through the hole portion 21 provided on the water tank 20. Therefore, in some embodiments, such a large-scale operation as to replace the first magnet 40 and the second magnet 41 may become unnecessary, so that a decrease in operation rate of the apparatus can be prevented.

Furthermore, in some embodiments, the magnetic body 50 may be mounted in a space between the first magnet 40 and the second magnet 41. Therefore, in some embodiments, even when the position of the magnetic body 50 is changed, the location of generation of the plasma region R may unlikely vary. Accordingly, the accuracy of the film forming position relative to the substrate 100 can be maintained. In some embodiments, when the magnetic body 50 is provided at the middle position between the first magnet 40 and the second magnet 41, in other words, at a position equally distant from the first magnet 40 and the second magnet 41, the location of generation of the plasma region R can be made more stable.

Moreover, in some embodiments, a plurality of magnetic bodies 50 may be mounted in a distributed manner on the first surface 32a of the supporting member 32. Therefore, in some embodiments, the film thickness can be adjusted in a plurality of areas, such as a central area or outer circumferential area of the substrate 100.

Figure 3A:
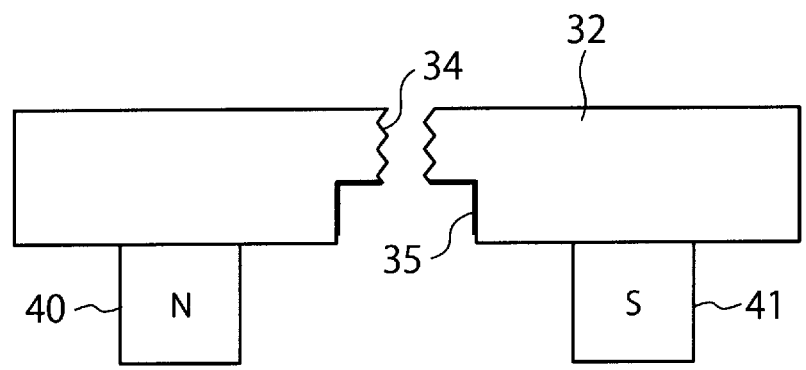
FIG. 3A is an enlarged sectional view of a portion of a supporting member according to some embodiments.
Figure 3B:
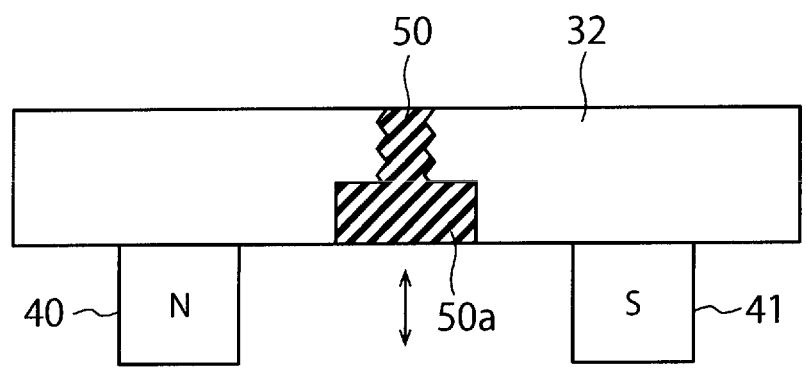
FIG. 3B illustrates a condition in which a magnetic body is attached to the supporting member illustrated in FIG. 3A.

FIG. 3A is an enlarged sectional view of a portion of a supporting member 32 according to some embodiments. FIG. 3B illustrates a condition in which the magnetic body 50 is attached to the supporting member 32 illustrated in FIG. 3A.

In some embodiments, as illustrated in FIG. 3A, the supporting member 32 includes a threaded hole 34 and a recess portion 35, which communicates with the threaded hole 34. In some embodiments, the magnetic body 50 is engaged with the threaded hole 34 as illustrated in FIG. 3B. With this configuration, in some embodiments, when the magnetic body 50 is rotated clockwise and counterclockwise, the head portion 50a of the magnetic body 50 may move backward and forward in the vertical direction between the supporting member 32 and the packing member 12.

In some embodiments, the recess portion 35 is able to contain the head portion 50a of the magnetic body 50 as illustrated in FIG. 3B. In some embodiments, when the head portion 50a is contained in the recess portion 35, it is possible that the magnetic field strength formed by the first magnet 40 and the second magnet 41 is not affected by the magnetic body 50. In some embodiments, a magnetic field environment without the magnetic body 50 can be produced. In some embodiments, this magnetic field strength may have an effect on the plasma region R, and, as a result, may have an effect on the thickness of a film formed on the substrate 100.

In some embodiments, since the variation range of the magnetic field strength broadens, the adjustable range of the film thickness can be broadened.

In the description of some embodiments, a component provided "on" or "over" another component can encompass cases where the former component is directly on (e.g., in physical contact with) the latter component, as well as cases where one or more intervening components are located between the former component and the latter component. In the description of some embodiments, substantially orthogonal or orthogonal can encompass a range of angular variation relative to 90° that is less than or equal to ±10°, such as less than or equal to ±5°, less than or equal to ±4°, less than or equal to ±3°, less than or equal to ±2°, or less than or equal to ±1°.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor manufacturing apparatus comprising:
    a vacuum chamber configured to contain a substrate and a target located opposite to the substrate;
    a rotary member having a first surface located on a back side of the target outside the vacuum chamber;
    a first magnet provided on the first surface;
    a second magnet having a magnetic pole opposite to a magnetic pole of the first magnet and provided on an inner side of the first magnet on the first surface; and
    a magnetic body provided between the first magnet and the second magnet and configured to be movable backward and forward in a direction orthogonal to the first surface,
    wherein the rotary member has a recess portion containing a portion of the magnetic body,
    wherein the magnetic body has a head portion in a disk shape or a cylindrical shape, and
    wherein the recess portion is configured to contain the head portion.

2. The semiconductor manufacturing apparatus according to claim 1, wherein the magnetic body is provided at a middle position between the first magnet and the second magnet.

3. The semiconductor manufacturing apparatus according to claim 1, wherein the rotary member has a threaded hole with which the magnetic body is engaged.

4. The semiconductor manufacturing apparatus according to claim 1, wherein the first magnet is mounted in a first semicircular shape and the second magnet is mounted in a second semicircular shape, and
    wherein the magnetic body is mounted both between a diameter portion of the first semicircular shape and a diameter portion of the second semicircular shape and between an arc portion of the first semicircular shape and an arc portion of the second semicircular shape.

5. The semiconductor manufacturing apparatus according to claim 1, further comprising a sensor configured to identify a position of the rotary member.

* * * * *